United States Patent [19]

Simms et al.

[11] Patent Number: 4,948,960
[45] Date of Patent: Aug. 14, 1990

[54] DUAL MODE LIGHT EMITTING DIODE/DETECTOR DIODE FOR OPTICAL FIBER TRANSMISSION LINES

[75] Inventors: Garfield Simms, Dover; Robert G. Hunsperger, Newark, both of Del.

[73] Assignee: The University of Delaware, Newark, Del.

[21] Appl. No.: 247,042

[22] Filed: Sep. 20, 1988

[51] Int. Cl.⁵ .................... G02B 27/42; G01C 3/12
[52] U.S. Cl. .................... 250/227.11; 357/19; 372/45; 250/551
[58] Field of Search .................... 250/227, 551; 350/96.11, 96.15; 357/17, 19; 372/44–46, 50

[56] References Cited

U.S. PATENT DOCUMENTS

| | | | |
|---|---|---|---|
| Re. 31,255 | 5/1983 | Geddes | 357/19 |
| 3,758,875 | 9/1973 | Hayashi | 372/45 |
| 3,952,265 | 4/1976 | Hunsperger | 357/19 |
| 4,136,928 | 1/1979 | Logan et al. | 357/19 |
| 4,143,385 | 3/1979 | Miyoshi et al. | 357/19 |
| 4,152,713 | 5/1979 | Copeland, III et al. | 357/19 |
| 4,176,367 | 11/1979 | Uematsu | 357/19 |
| 4,194,162 | 3/1980 | Uematsu et al. | 357/19 |
| 4,202,000 | 5/1980 | Carballes | 357/19 |
| 4,216,486 | 8/1980 | Geddes | 357/19 |
| 4,281,253 | 7/1981 | Culver | 250/551 |
| 4,297,653 | 10/1981 | Scifres et al. | 357/19 |
| 4,533,833 | 8/1985 | Copeland et al. | 250/551 |
| 4,565,924 | 1/1986 | Misumi et al. | 250/551 |
| 4,614,873 | 9/1986 | Umeji | 250/551 |
| 4,742,013 | 5/1988 | Menigaux | 372/45 |
| 4,744,623 | 5/1988 | Prucnal et al. | 250/227 |
| 4,773,074 | 9/1988 | Hunsperger et al. | 357/19 |
| 4,785,457 | 11/1988 | Asbeck et al. | 372/45 |
| 4,790,620 | 12/1988 | Niwayama | 357/19 |

Primary Examiner—David C. Nelms
Assistant Examiner—Stephone B. Allen
Attorney, Agent, or Firm—Connolly & Hutz

[57] ABSTRACT

This invention relates to a double heterostructure diode and photodiode which is selectively switchable between an emission mode and receiving mode. A light emitting active region is localized and restricted by limitation of the area of contact to a window in a silicon dioxide layer and an optical fiber is coupled to the diode at a lateral surface to provide substantially greater light emission from the lateral surface than from side emission.

8 Claims, 2 Drawing Sheets

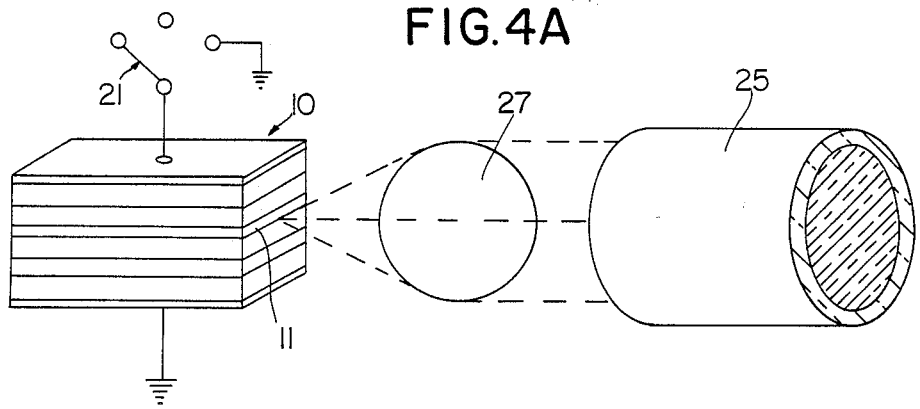
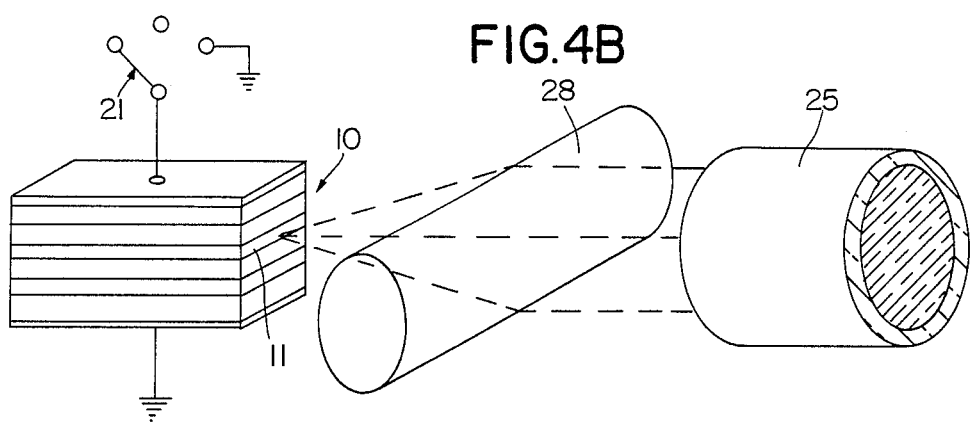
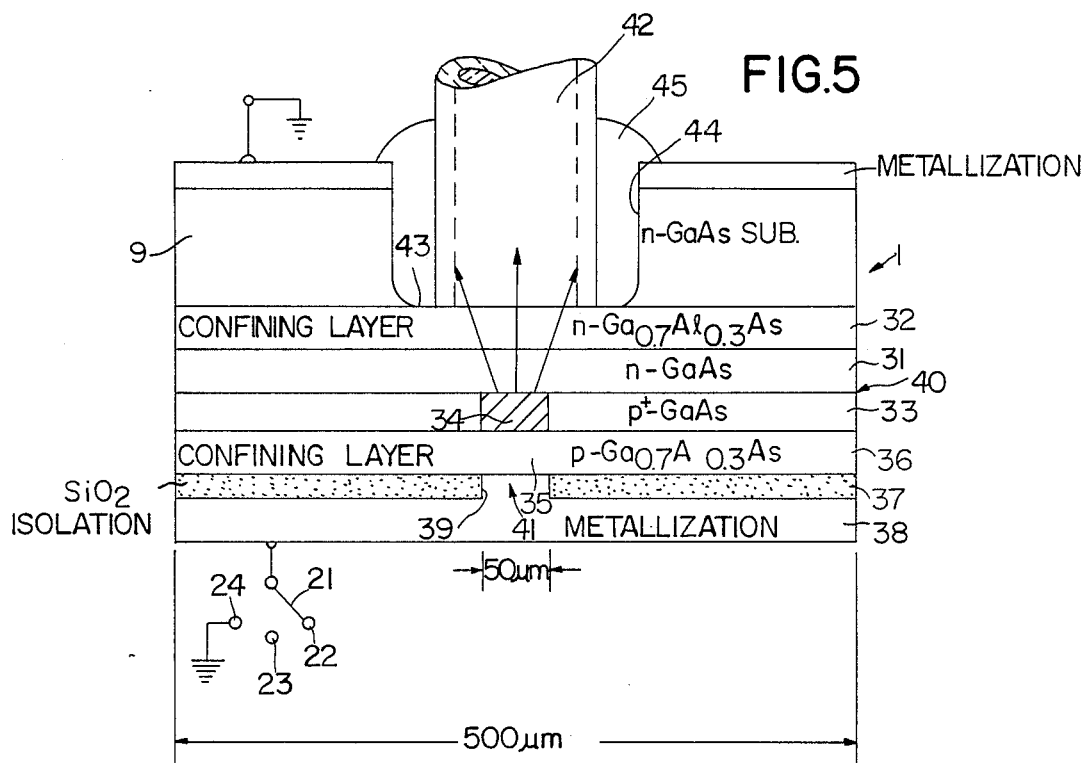

DUAL MODE LIGHT EMITTING DIODE/DETECTOR DIODE FOR OPTICAL FIBER TRANSMISSION LINES

Field of the Invention

The invention relates to semiconductor diode devices for direct optical coupling to optical fibers or other waveguides in optical signal transmission. In particular, the invention embraces a unitary combination of a double heterostructure light emitting diode (DH-LED) for emission and that of a photodiode as a detector, the combination being characterized by an interposed lightly doped waveguide element between a heavily doped active layer and a semiconductor confining element of the diode. The diode can be switched from the emitter mode to a detector mode by application of a reverse-bias electric field instead of the forward bias field used for emission.

Background

Practical transmission of signals by optical beams through thin transparent fibers rather than by electrical currents through electrically conductive wires or radio waves became a reality after the development in the early 1960's of the semiconductor laser and the semiconductor light emitting diode, both of which provide a stable source of monochromatic light. The emergence of the concept of "integrated optics", wherein wires and radio links were replaced by optical fibers and waveguides rather than through-the-air optical paths progressed further by development of miniaturized optical integrated circuits to replace conventional circuits. This major advance was enhanced by the creation of gallium aluminum arsenide (GaAlAs) diodes and photolithographic microfabrication technology capable of producing ultraminiature devices with submicron line widths.

Advantages of the current state of optical fiber transmission lines over electrical counterparts include its stability, its wide bandwidth, its freedom from noise and external interference and its greater utility afforded by the small size of practical equipment. The last advantage is obtained by using miniature semiconductor lasers or light emitting diodes for introducing optical signals into an optical fiber and coupling photodiodes to the fiber for detection. Earlier systems, however, required bulky, vibration-sensitive combinations of mirrors, prisms, and gratings to direct an optical beam carrying a signal from the emitter to the appropriate photodiode detector. Although such apparatus was at least comparable to or better in the reliability than existing electrical means of signal transmission, this and other difficulties have retarded acceptance of fiber-optic signal transmission.

One of the difficulties of earlier systems was the necessity for separate emitter and detector diodes to introduce the signal into one end of a fiber and to detect the signal at the other end of the fiber. This difficulty was significantly mitigated by Hunsperger in a system (U.S. Pat. No. 3,952,265, issued Apr. 20, 1976, to R. G. Hunsperger) which provides a unitary dual mode diode which can function as an emitter or detector. Basically, this dual mode diode is a p-n junction diode that functions as a laser when forward biased and as a photodiode when reverse biased, or with no voltage applied, the diode is in a neutral state with a relatively low insertion loss which does not interfere with the functioning of other devices on the transmission line.

A significantly improved laser/detector diode, with a highly efficient emission/detection structure, has been developed by Hunsperger & Park (U.S. Pat. No. 4,773,074 issued Sept. 20, 1988). That device is ideally suited for use with small diameter (210 $\mu$m) single mode fibers such as those used in long distance telecommunications, but it is difficult to efficiently couple it to larger diameter (2100 $\mu$m) multimode fibers such as those used in many local area networks.

The present device is a unitary p-n junction diode for direct coupling to optical fiber transmission lines or other waveguides in which the diode is adapted to selectively function both as an emitter and receiver. It is particularly suitable for use with large diameter multimode fibers. In this embodiment, the active (light emitting) p-type semiconductor layer of the diode is highly doped to increase light emission efficiency, while sensitivity as a receiver is increased by application of a reverse bias that is large enough to activate the Franz-Keldysh effect, while efficient coupling is provided by means of a low-loss lightly doped waveguide layer interposed between the active layer and a confining layer to increase the effective receiving area for incident light.

The diode is a unitary combination of double heterostructure (DH) light emitting diode (LED) and photodiode geometries having a low-loss waveguiding element interposed between its active layer and a confining layer.

It is an object of the invention to provide a diode device for introducing optical signals into a fiber-optic line in which optical power is emitted from a lateral surface of the diode into an optical fiber coupled to the diode through an opening in the diode substrate.

It is also an object that such diode operate efficiently as a light detector when reverse biased.

A further object of the invention is substantially greater emission and detection efficiency from a lateral surface of the diode than by side emission or detection through an endface of the diode chip, particularly to facilitate the use of larger diameter multimode optical fibers.

Summary of the Invention

In the embodiment of the present invention the p-n junction diode is directly coupled to an optical fiber at a lateral surface of the diode. The LED detector structure has four liquid phase epitaxially grown layers. The light emitting active region is localized by a small-area p-type contact. The waveguiding layer is lightly doped. When the diode is reverse biased the lightly doped layer is substantially depleted of carriers and the device acts as a p-n junction photo diode and exhibits the Franz-Keldysh Effect. When the diode is forward biased, incoherent light is emitted from the top surface and the sides but the optical power from the top surface is about 30 times greater than the side emission.

The dual mode LED/detector device of the invention can be fabricated using liquid phase epitaxy (LPE), molecular beam epitaxy (MBE) or by metal-organic chemical vapor deposition (MOCVD).

Description of the Drawing

In the Drawings:

FIGS. 4a and 4b illustrate the employment of microlenses to improve coupling an optical fiber to the active area of the diode.

FIG. 5 illustrates a geometry configuration of the diode of the present invention.

Description

Figure 1:
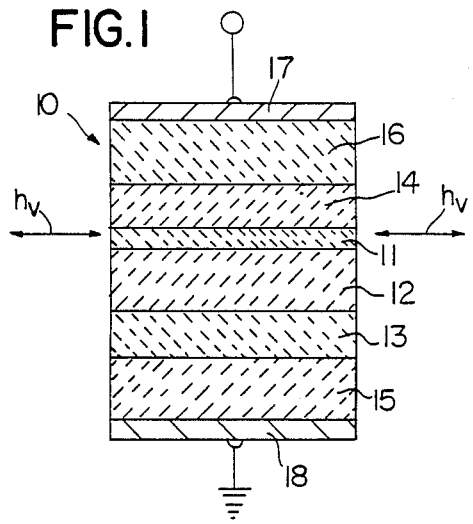
FIG. 1 schematically illustrates a layered structure embodiment of a dual mode LED/detector diode of U.S. application Ser. No. 9,863 filed Feb. 2, 1987.

U.S. Pat. No. 3,952,265, issued Apr. 20, 1976, to Robert Hunsperger, is incorporated by reference as background teaching and for methods applicable to the instant invention.

Attention is directed to solving problems relating to direct coupling of laser and photoreceptor diodes to waveguides and fibers by taking advantage of the geometry of both waveguide photodiodes and double heterostructure (DH) laser diodes as set forth in U.S. application Ser. No. 9,863. In waveguide photodiodes, because all incident light signals are absorbed directly in the plane of the depletion layer, not only is the quantum efficiency high, but also the diffusion time delay of carriers is eliminated. Because the waveguide detector of the referenced invention has a lightly doped waveguiding layer that is relatively thick compared to the junction depletion thickness of a conventional p-n diode, it has reduced junction capacitance resulting in good high frequency response. The double heterostructure, the most widely used structure for semiconductor lasers, with a low threshold current density and high efficiency resulting from carrier and photon confinement, provides good emission properties to the unitary combination.

Three factors having internally competitive behavior which affect the use of DH laser diodes as waveguide photodetectors have been identified and resolved:

First, in a DH laser, the absorption loss coefficient must be small to lower the threshold current density and to increase efficiency, while in a waveguide photodiode, however, a large absorption coefficient, $\alpha$, is essential for high quantum efficiency and sensitivity.

The second factor involves competition between the optimum structure for lasers and the optimum structure for photodiodes, related to the dimensions of the depletion layer. To get a population inversion in the active region with low series resistance, layers of a DH laser are heavily doped, typically at a concentration of around $10^{18} cm^{-3}$. The maximum depletion layer thickness for this doping concentration is only 0.08 micrometer ($\mu m$). This depletion layer thickness is about one fiftieth that of a conventional photodiode. However, such an extremely thin layer increases junction capacitance to 50 times that of a conventional photodiode so that high frequency response is severely limited by the high R-C time constant. Further, it is very difficult to couple all of the incident light into an extremely thin depletion layer. If the incident light is not confined in the depletion region, not only would the quantum efficiency be reduced, but also time delay associated with carrier diffusion would further reduce response speed.

The third factor in internal competitive effects arises from device length. For high efficiency, the DH laser must not be too long. On the other hand, a waveguide photodiode requires a large product of the absorption coefficient and the device length for high quantum efficiency. Should there be a means to increase the absorption coefficient dramatically, the device length would no longer be a problem.

These three factors which are important in the laser/detection devices of U.S. Pat. No. 3,952,265 and U.S. application Ser. No. 9,863 are also important in the present invention of a light emitting diode and photodiode in unitary combination.

The present invention has provided trade-off in the foregoing factors and thus enabled construction of a direct-coupled, dual-mode diode of high optical output and the capability of both emitting and detecting light with high efficiency.

As a trade-off and a solution to the first and third of the foregoing factors, the Franz-Keldysh effect is used to change the absorption coefficient electrically, as described is the Hunsperger patent, noted above. (For a detailed background, see "Integrated Optics: Theory and Technology," Hunsperger, R. G., Springer-Verlag, Berlin, Heidelberg, N.Y., 1982, especially page 260 et seq.) For n type GaAs an experimental value $\alpha = 10,000$ $cm^{-1}$ (i.e., almost total absorption) results from an applied field of $1.3 \times 10^5$ V/cm, which corresponds to 13 V reverse bias across a depletion width of 1.0 $\mu m$. Thus, it can be seen that the diode can be electrically switched from a low absorption state for LED operation to high absorption state for detection, by means of a reasonably small bias voltage.

The second of the foregoing factors is the problem of getting a sufficiently thick depletion layer without diminishing LED efficiency. This problem is solved by the present invention by both photodiode and DH LED geometries including a lightly doped, low loss waveguiding layer, upon which incident light enters, between the active layer and one of the confining layers.

Reference to FIG. 1 will facilitate understanding the basic structure of a dual mode laser/detector as disclosed in U.S. application Ser. No. 9,863. Shown in the drawing, not to scale, is a cross-sectional view of diode 10 with heavily doped active layer 11 of p-type gallium arsenide (GaAs). Waveguiding layer 12 is lightly doped n-type GaAs, with a doping concentration of $5 \times 10^{15}$ to $3 \times 10^{16} cm^{-3}$. The thickness of the waveguiding layer is slightly less than the maximum depletion layer width at breakdown i.e., less than 1.0 to 5.0 $\mu m$. The doping concentration of the active layer is about $10^{18} cm^{-3}$ or higher with a thickness of 0.5 $\mu m$ or less.

Continuing in reference to FIG. 1, confining layer 13 of gallium aluminum arsenide (GaAlAs) is doped for n-type conductivity while confining layer 14 also GaAlAs is doped as p-type, while substrate 15 is n-type GaAs and cap 16 is p-type GaAs. Electrode 17 and ground contact 18 provide means for application of the Franz-Keldysh reverse bias voltage in selection of the mode of operation of the diode as a detector or application of forward bias voltage for operation as an emitter. When the diode is reverse biased for the detecting mode of operation, the lightly doped waveguiding layer will be mostly depleted and act as a $p^+$-$n^-$ waveguide photodiode, exhibiting the Franz-Keldysh effect.

For a waveguiding layer having a doping concentration of $n = 2 \times 10^{16} cm^{-3}$ and a thickness of 1.5 $\mu m$, the maximum depletion layer width is 1.8 $\mu m$ for a breakdown reverse bias field of $4.8 \times 10^5$ V/cm, which corresponds to about 86.4 volts bias across the p-n junction. Due to the Franz-Keldysh effect, the absorption coefficient, $\alpha$, can be increased from 25 to $10^4 cm^{-1}$ by applying a reverse bias field of $1.35 \times 10^5$ V/cm, which corresponds to 20.2 volts reverse bias across a resulting depletion width of 1.5 μm. Therefore, 99% of the incident photons will be absorbed within 9 μm. In addition to a high quantum efficiency, a high speed response of the detector can be expected because of reduced capacitance and the high electron mobility of lightly doped GaAs, as well as elimination of the time delay associated with the diffusion of carriers and the possibility of using small-area stripe geometry.

When the diode is forward biased for the lasing mode of operation, injected electrons and holes are confined in the active layer, and generated photons are confined in the waveguiding layer and the active layer. If the radiation is distributed uniformly in both layers, the effective absorption coefficient, α, is given by $$\alpha = \frac{d_1}{d_1 + d_2} \alpha_1 + \frac{d_2}{d_1 + d_2} \alpha_2$$

where $d_1$ and $d_2$ are thicknesses of the active layer and the waveguiding layer respectively, and $\alpha_1$ and $\alpha_2$ are the absorption coefficients of the active layer and waveguiding layer, respectively. The coefficient $\alpha_1$ depends upon the hole concentration and the injected electron density, and is about 30 cm$^{-1}$ according to the literature, if scattering losses are negligible. The coefficient $\alpha_2$ depends upon the free electron concentration in the waveguiding layer because the lasing photon energy of the highly doped p-type active layer is substantially (30–50 meV) below the absorption edge of the lightly doped n-type layer. Therefore, a reasonable estimate of $\alpha_2$ is 6 cm$^{-1}$. The calculated effective absorption coefficient is from 8 cm$^{-1}$ for $d_2 = 5$ μm to 14 cm$^{-1}$ for $d_2 = 1$ μm.

When the diode is in the neutral state, there are no injected carriers in the waveguiding layer and $\alpha_2$ becomes less than 6 cm$^{-1}$. This means that the waveguiding layer is almost transparent to the operating wavelength. Since the dual mode diode has a low absorption coefficient, a low insertion loss is expected when the device is very effectively connected in series in a fiber-optic communication system.

The threshold current density, $J_{th}$, and overall power efficiency $\theta$tot, will be similar to the large optical cavity (LOC) laser which has separate confinement of photons and carriers. Threshold current density ($J_{th}$) ranges from 2000 to 8000 A/cm$^2$ for active layer thicknesses ($d_2$) from 1.0 to 5.0 μm, respectively. Those values are slightly higher than a typical $J_{th}$ of a DH laser as a result of the added waveguiding layer. The waveguiding layer can be thicker than 5.0 μm with a doping concentration less than $5 \times 10^{15}$cm$^{-3}$ at the expense of a considerably higher threshold current density ($J_{th}$). Also, excessively large active layer thicknesses can lead to increased carrier drift time and limit the high frequency response of the laser. The efficiency of the diode of U.S. patent application Ser. No. 9,863 is typical of that of a DH laser, $\eta$tot≈40%. Therefore, it can be seen that the added waveguiding layer slightly increases $J_{th}$, but does not significantly affect the efficiency of the laser.

An advantage of the above-described diode compared to a conventional DH laser is the high optical output power capability of the diode due to the added waveguiding layer. The high optical flux density in the DH laser with a very thin active layer leads to catastrophic failure by mechanical mirror damage at relatively low peak power, which limits optical output power. This limitation is avoided in the new diode by having the optical field distributed over a large waveguiding layer, permitting high optical power operation without failures from this cause.

As was seen in the foregoing, a DH laser with a lightly doped waveguiding layer can be used as a high power light source with a reasonable $J_{th}$ and efficiency when forward biased. When this diode is reverse biased with an appropriate electric field, high quantum efficiency and high response speed of the detector result in part from the narrow channel waveguide geometry. It is important to observe that waveguiding depends upon a difference in the index of refraction between the waveguiding layer and the adjacent layers, the active layer and the confining layers. The dual mode laser/detector diode is effectively fabricated by using liquid phase epitaxy (LPE), molecular beam epitaxy (MBE) or the metal-organic chemical vapor deposition (MOCVD) method as in fabrication of conventional diodes. The dual mode diode of U.S. patent application Ser. No. 9,863 has a narrow stripe of 5 to 25 μm width for a low threshold current ($J_{th}$) and a small junction capacitance. The devices are mounted on a gold-plated copper heat sink for continuous-wave (cw) operation.

Figure 2:
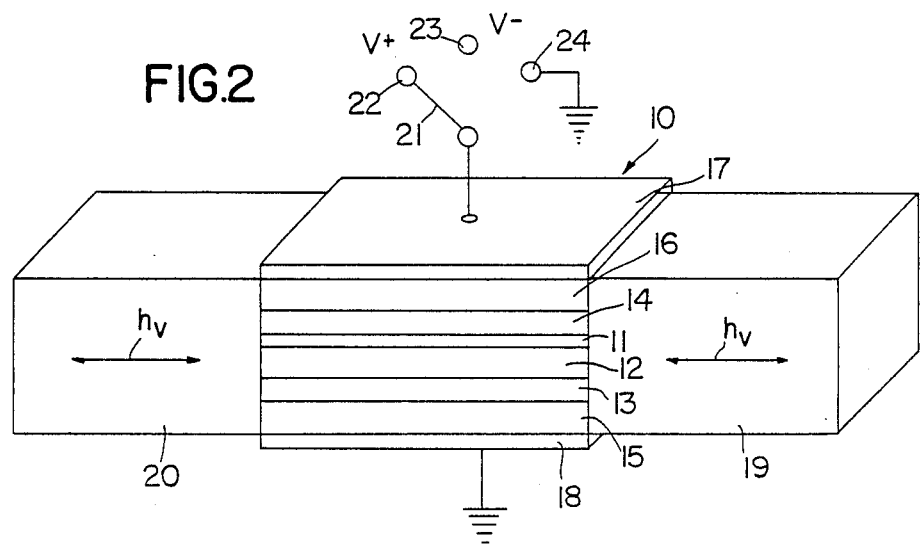
FIG. 2 illustrates the diode directly coupled to an optical waveguide of an optical integrated circuit.

As noted hereinbefore, the dual mode diode can be used either as a discrete element or as a monolithic optical integrated circuit element. The latter employment is illustrated schematically in FIG. 2 wherein numerals designate corresponding parts as in FIG. 1. Referring to FIG. 2, diode 10 the respective layers 11 to 16 and contacts 17 and 18 are as shown in FIG. 1, additionally showing directly-coupled optical wavequide element 19 of an integrated optical circuit, of which similar optical wavequide 20 forms a continuing part. Also shown is switch 21 to provide a forward bias by pole 22, or reverse bias by pole 23 in accordance with the intended use of the diode as an emitter or receiver, respectively. With no bias, provided by pole 24 as stated hereinbefore, the diode is neutral so that optical signals pass through from optical waveguide element 19 to the corresponding element 20 of the optical integrated circuit.

In operation, referring to FIG. 2, with an appropriate forward bias voltage applied through switch 21 in position 22, diode 10 acts as an emitter (laser) so that light emerges and enters the waveguide directly as shown by double-ended arrows hv. With reverse bias switch 21 in position 23 diode 10 acts as a receiver or detector so that light from other elements in the circuit, as indicated by either of double-ended arrows hv, enters and is detected to be converted to an electrical signal to be fed to electrical utilization elements. With switch in position 24 (ground) diode is neutral so that signal passes through substantially unaltered from element 19 to 20 or conversely.

Figure 3:
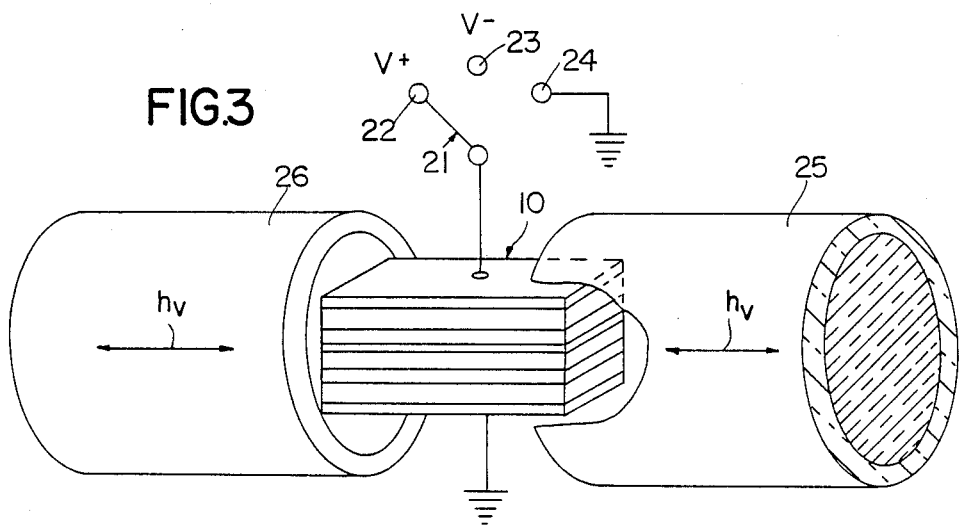
FIG. 3 illustrates the diode in a fiber-optic circuit.

FIG. 3 illustrates diode 10 directly coupled to optical fibers 25 and 26, with behavior similar to that with waveguide 19 and 20.

As described, the dual mode device can be used either as a discrete element or as a monolithic optical integrated circuit element. In monolithic form, it can be combined with other devices on the same chip to perform its function more effectively. For example, a metal-semiconductor field effect transistor (MESFET) and a dual mode diode can be formed on the same n-GaAs layer. Thus, a MESFET can be used to modulate the laser when forward biased by applying a signal to the gate electrode, and when the device is reverse biased, the signal can be amplified by the MESFET. This combination of a laser/detector diode with a laser-driver-/amplifier FET is usable at high frequencies. In discrete form, as described by Hunsperger in U.S. Pat. No. 3,952,265, dual mode devices can be either connected in series by a waveguide or a fiber, or connected to each other through a star coupler.

Coupling the device as mentioned in the foregoing, can be either direct butt-joint coupling or by using intermediate optics. One of the simpler coupling schemes is to place the ends of the waveguide or fiber close to the active area of the diode. Diode-to-fiber coupling efficiencies near 30% are typically obtained by this direct butt coupling. However, the fiber-to-diode coupling efficiency is usually difficult because of the large area mismatch between the active area of the diode and the core area of the fiber if a multimode fiber is used. Spherical or cylindrical microlenses cemented between the end of a fiber and the diode improve the fiber-to-diode coupling efficiency by focusing the light from the fiber onto the active area of the dual mode diode, as shown in FIG. 4 (a) and (b). In FIG. 4 (a) spherical lens 27 focuses light from the fiber 25 on the active area of diode 10 while in FIG. 4 (b) it is focused by cylindrical lens 28 when the diode functions as a receiver. Similarly, when the diode is in the emitter mode, since the output angle of the laser is greater than the fiber acceptance angle, using a microlens can also improve the diode-to-fiber efficiency.

In FIG. 1 to FIG. 4, the emitter/detector (for use with an applied Franz-Keldysh bias to control its functional mode) is shown as a device having light confinement only in the vertical direction (i.e., parallel to the direction of current flow).

FIG. 5 illustrates the embodiment of the present invention, which incorporates the highly efficient multilayer carrier and optical confinement structure of the above described laser/detector diode but also provides for the coupling of an optical fiber through the surface of the device rather than through an endface. This feature of the present invention makes it suitable for use even with multimode optical fibers that have too large a diameter to be efficiently coupled to the endface of a laser/detector diode. The LED/detector structure of the embodiment shown in FIG. 5 is a modified Burrus diode structure having four liquid phase epitaxially grown layers which are formed by conventional source-seed slidebar growth technique.

FIG. 5 schematically illustrates in a sectional view the layered structure embodiment of a dual LED/detector diode of the invention with coupling to a wave guide.

FIG. 5 is a cross sectional view of diode 1 with a lightly doped layer 31 of n-type gallium arsenide (GaAs) with a doping concentration of about $10^{15}cm^{-3}$ and a confining layer 32 of n-type gallium aluminum arsenide (GaAlAs) over the waveguiding layer 31. A junction 40 is provided between the waveguiding layer 31 and layer 33 which is of p-type gallium arsenide (GaAs). The layer 33 has an active region 34 for light emission. The active region 34 is provided by a p-type contact 35 to a confining layer 36 of p-type gallium aluminum arsenide (GaAlAs) which underlies the layer 33. A silicon dioxide isolation layer 37 lies between the confining layer 36 and a metalization substrate 38.

An opening 39 is etched through the silicon dioxide layer 37 to provide a circular metal contact 41 of the metalization substrate with the layer 36.

An optical fiber comprised of a multimode fiber 42 of an optical circuit is coupled to the diode at the surface 43 of layer 42 through a window 44 in the substrate 9. As shown in FIG. 5, the window 44 around the optical fiber 42 is filled with an insulation 45 such as an index matching epoxy. The optical fiber 42 acts with behavior similar to that of a wave guide.

This diode 1 is a combination LED/detector diode. For transmission the junction is forward biased and acts as a light emitting diode. For reception the diode is reverse biased and acts as a junction photodiode or detector.

In a specific embodiment of the FIG. 5 device the doping concentration on the p-type side of the junction is $N_A = 1 \times 10^{19}/cm^3$ and that on the n-type side is $N_D = 1 \times 10^{16}/cm^3$. For this doping, the maximum predicted emission efficiency is $\eta = 13.5\%$ and the maximum modulation frequency is 50 MHz, where the frequency response is limited by the RC time constant.

When operated as a detector the light is transmitted into the device 1 through the fiber 42. Operated as a detector under a reverse bias of 50 V, the device has a maximum RC-limited frequency response of 300 MHz, based on its junction capacitance of $0.425 \times 10^4 pF/cm^2$, an area of 500 um $\times$ 500 um, and a maximum responsivity of 0.709 A/W. It will be understood that the actual frequency response obtained in a given circuit would be determined by the product of the junction capacitance and the required load resistance, and would be less than 300 MHz. Operated at a reverse bias of 50 V, the internal quantum efficiency (number of carriers generated/number of photons entering active region) is calculated to be 97.6%, because of the large absorption coefficient produced by the Franz-Keldysh Effect. The calculated reverse-bias breakdown voltage of the diode is 57.9 V.

In this diode the four layers, 31, 32, 33, and 36 are epitaxially grown layers. The opening 19 restricts the recombination of carriers to an area directly below the fiber 42. This in turn permits an increase in the amount of light coupled into the fiber.

The p-type GaAs layer 33 is highly doped, as for example $1 \times 10^{18}/cm^{-3}$ while the n-type GaAs layer 31 is lightly doped, for example $1 \times 10^{16}/cm^{-3}$. The layers 32 and 36 are preferably thin and of the order of 0.5–1 $\mu$m. Layer 33 is also thin. The thickness of layer 31 is determined by calculations based on reverse bias.

It will be understood that the region 34 is where the light is generated when the device is operating under forward bias. When the device is operating under reverse bias the active element for the detection mode is the whole layer 33 and the whole layer 31.

In an embodiment of the present invention the layer concentrations are determined as functions of carrier lifetimes and diode capacitance. A high p concentration is associated with a very short radiative lifetime. However, if n is increased as well, the total capacitance of the device also increases. Secondly, when the device is in reverse bias, a large value for n will produce a small breakdown voltage since $$V_{br} \propto \frac{1}{N_B}$$

where $n_B$ = the background concentration.

Therefore, the p-type GaAs region must be highly doped and conversely, the n-type GaAs layer 31 must be lightly doped. In particular, $p \geq 1 \times 10^{19}/cm^3$ and $n = 1 \times 10^{16}/cm^3$ The GaAlAs layers 32 and 36 are kept as thin as possible, to decrease optical losses and increase carrier collection (0.5–1 μm). The GaAs layers are made very thin to compress the carriers into a very small volume and benefit from a high injection efficiency as well as short lifetimes. The thickness of the n-GaAs layer 31 is determined from reverse bias calculations. To avoid the depletion of the GaAs layers extending into the GaAlAs layers at breakdown, the depletion width must be less than the n-layer 31 thickness $d_2$. Thus, $$d_2 \geq \omega = \sqrt{\frac{2\epsilon_s(V_0 + V_{br})}{q} \frac{(p+n)}{pn}}$$

and, since $p >> n$ $$d_2 \geq \sqrt{\frac{2\epsilon_s(V_0 + V_{br})}{q}} \frac{1}{n} = 3 \mu m$$

for $n = 1 \times 10^{16}$ cm$^{-3}$ and for $V_{br}$ given by $$V_{br} = \frac{\epsilon_s E_m^2}{2q} \frac{1}{n}$$

where $E_m$ = the breakdown field $\simeq 4 \times 10^5$ V/cm and $V_0$ = the built in voltage and $q$ = the electron charge.

The carrier concentration in the two GaAlAs confining layers 32 and 36 is $10^{18}$/cm$^3$ or greater to minimize series resistance, and the n-type GaAs substrate is heavily doped ($\eta \geq 10^{18}$/cm$^3$) for the same reason. For proper optical confinement the aluminum content of the Ga$_{-x}$Al$_x$As$_s$ layers is $0.24 \geq x \geq 0.4$, with the nominal value being 0.3.

The chip size should be in the range from 20×20 mil, as shown in FIG. 1, to 30×30 mil if required for reliable bonding to a header.

Primary considerations in the design of the electrical control circuit are switching the diode from emission mode to detection mode and from detection mode to emission mode. The emitter to detector delaytime is longer due to the stored charge in the junction of the diode under forward bias that must be depleted under reverse bias. Design proposals involve control circuitry to turn on and off some power FETs to switch the bias on the emitter/detector diode. The control signal is generated by monitoring the EOT (end of transmission) sequence that the data link protocol uses. Depending upon the application, the idle state of the diode may either be reverse bias detection mode or zero bias passive mode. Switching the diode to reverse bias after it has been forward biased produces a voltage spike due to the stored charge in its active region that decays with an RC time constant delay. Using a FET with a low ON resistance to shunt the current to ground will reduce this delay.

It should be noted that the multilayer structure of the diode of this invention is not limited to be of GaAs and GaAlAs. Other combinations of suitable ternary and quaternary semiconductors can also be used. For example, a multilayer structure of GaInAsP on an InP substrate would be useful if an operating wavelength in the range of 1.2 to 1.7 μm were desired rather than the 0.9 um wavelength that would be emitted by the GaAs/GaAlAs structure of FIG. 5.

Also lenses can be used with LED detector.

What is claimed is:

1. A unitary emitter-detector semiconductor diode device with the capability of direct optical coupling to optical transmission lines, the device having means for coupling to electrical forward bias and electrical reverse bias for selection between an optical emitter mode and an optical detector mode, and contact means for coupling to external electrical circuits, the improvement comprising:
   a unitary combination of a double heterostructure diode having optical and carrier confinement and a photodiode;
   in said combination a heavily doped semiconductor active layer of one conductivity type of a configuration having opposed surfaces, lateral edges and longitudinal ends, one surface of the said active layer forming a p-n junction with one surface of a coextensive lightly doped semiconducting waveguiding layer of a conductivity type opposite to that of the active layer;
   a first confining layer having a surface in contact with another surface of the waveguiding layer;
   a second confining layer having a surface in contact with the other of the opposed surfaces of said heavily doped active layer;
   a restricted electrical contact to the surface of the second confined layer opposite to the active layer contacting surface;
   and an optical fiber coupled to the surface of the first confining layer opposite to the waveguiding layer contacting surface,
   so that the recombination of carriers is isolated to an area directly within the area of the optical fiber.

2. A device as claimed in claim 1; electrical contact means for establishing electrical connection to said device so that said diode can be biased in either a forward or reverse direction and; wherein said active layer has a region defined by the restricted electrical contact which region is the site of light generation when the device is operating under forward bias.

3. A device as claimed in claim 1 wherein the active layer has a thickness of the order of 0.5 μm, the waveguiding layer has a thickness of the order of 3 μm, and the confining layers each have a thickness in the range of 0.5–1 μm.

4. A device as claimed in claim 1 wherein the p-type active layer has an impurity concentration of greater than $10^{19}$cm$^3$ and the n-type waveguiding layer has an impurity concentration of less than $10^{16}$cm$^3$.

5. A unitary emitter-detector semiconductor device as claimed in claim 1 wherein said optical fiber is a multimode optical fiber.

6. A unitary emitter-detector semiconductor device as claimed in claim 5 wherein the device has a substrate layer on the surface of the first confining layer opposite to the waveguiding layer contacting surface and a window through said substrate extending to said surface of the first confining edge.

7. A unitary emitter-detector semiconductor device as claimed in claim 6 wherein the optical fiber is fixed in the window.

8. A unitary emitter-detector semiconductive device as claimed in claim 7 wherein an epoxy resin attaches the fiber to the device in the window.

* * * * *